(12) United States Patent
Sharma et al.

(10) Patent No.: US 12,543,349 B2
(45) Date of Patent: Feb. 3, 2026

(54) TRANSISTORS WITH FERROELECTRIC GATES

(71) Applicant: Intel Corporation, Santa Clara, CA (US)

(72) Inventors: Abhishek A. Sharma, Portland, OR (US); Ravi Pillarisetty, Portland, OR (US); Brian S. Doyle, Portland, OR (US); Elijah V. Karpov, Portland, OR (US); Prashant Majhi, San Jose, CA (US); Gilbert W. Dewey, Beaverton, OR (US); Benjamin Chu-Kung, Portland, OR (US); Van H. Le, Beaverton, OR (US); Jack T. Kavalieros, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 166 days.

(21) Appl. No.: 18/174,825

(22) Filed: Feb. 27, 2023

(65) Prior Publication Data
US 2023/0223475 A1 Jul. 13, 2023

Related U.S. Application Data

(62) Division of application No. 16/142,940, filed on Sep. 26, 2018, now abandoned.

(51) Int. Cl.
*H10D 30/69* (2025.01)
*H10B 51/00* (2023.01)
*H10B 51/20* (2023.01)
*H10B 51/30* (2023.01)
*H10B 80/00* (2023.01)
*H10B 99/00* (2023.01)
*H10D 30/01* (2025.01)
(Continued)

(52) U.S. Cl.
CPC .......... *H10D 30/701* (2025.01); *H10B 51/00* (2023.02); *H10B 51/20* (2023.02); *H10B 51/30* (2023.02); *H10B 80/00* (2023.02); *H10B 99/22* (2023.02); *H10D 30/0415* (2025.01); *H10D 64/685* (2025.01); *H10D 64/689* (2025.01); *H10D 30/62* (2025.01); *H10D 30/6739* (2025.01)

(58) Field of Classification Search
CPC ........ H10B 51/00; H10B 51/20; H10B 51/30; H10B 80/00; H10B 99/22; H10D 30/0415; H10D 30/62; H10D 30/6739; H10D 30/701; H10D 64/685; H10D 64/689
See application file for complete search history.

(56) References Cited

U.S. PATENT DOCUMENTS 8,604,518 B2 12/2013 Bhuwalka et al.
2002/0038402 A1 3/2002 Kanaya
(Continued)

FOREIGN PATENT DOCUMENTS

CN 104425576 A * 3/2015 ....... H01L 21/02148
JP 2001110996 A 4/2001

*Primary Examiner* — Matthew E Warren
(74) *Attorney, Agent, or Firm* — Akona IP PC

(57) ABSTRACT

Disclosed herein are transistors with ferroelectric gates, and related methods and devices. For example, in some embodiments, a transistor may include a channel material, and a gate stack, and the gate stack may include a gate electrode material and a ferroelectric material between the gate electrode material and the channel material.

20 Claims, 6 Drawing Sheets

(51) Int. Cl.
    *H10D 30/62*    (2025.01)
    *H10D 30/67*    (2025.01)
    *H10D 64/68*    (2025.01)

(56) References Cited

U.S. PATENT DOCUMENTS

| | | | |
|---|---|---|---|
| 2008/0303119 A1* | 12/2008 | Watanabe | H10D 64/691 |
| | | | 257/632 |
| 2017/0162702 A1 | 6/2017 | Hu et al. | |
| 2017/0330624 A1* | 11/2017 | Lim | H10B 43/30 |
| 2019/0207009 A1* | 7/2019 | Yamaguchi | H10D 30/701 |
| 2019/0273087 A1 | 9/2019 | Morris et al. | |
| 2022/0376114 A1 | 11/2022 | Müller | |

\* cited by examiner

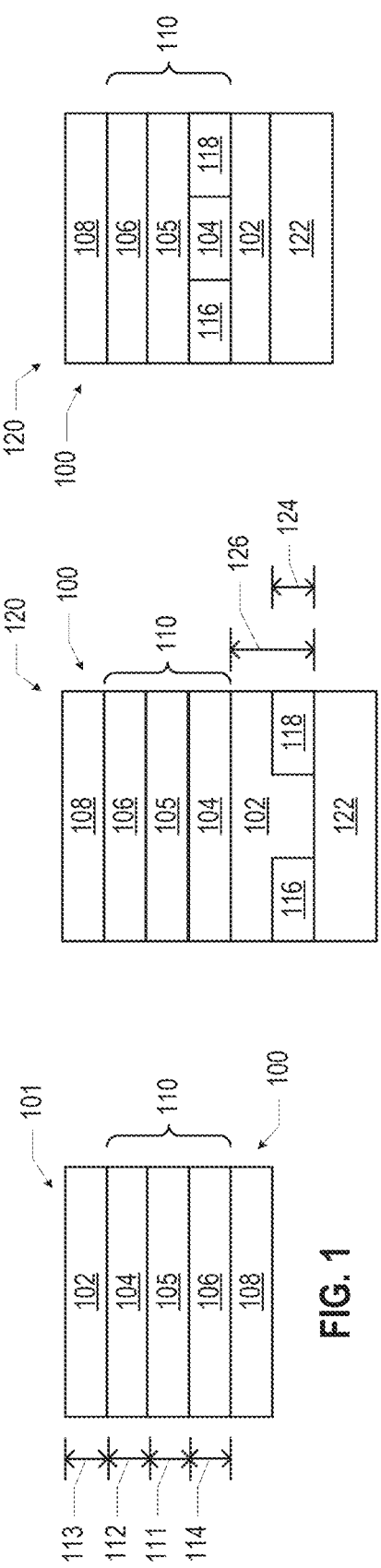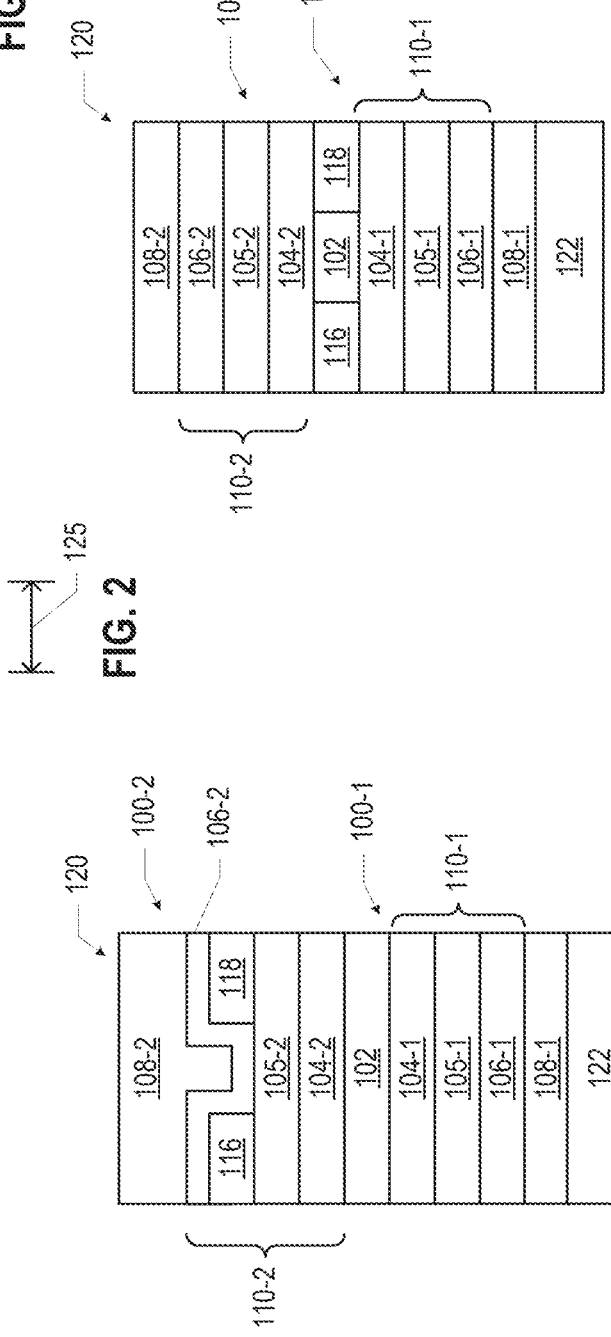

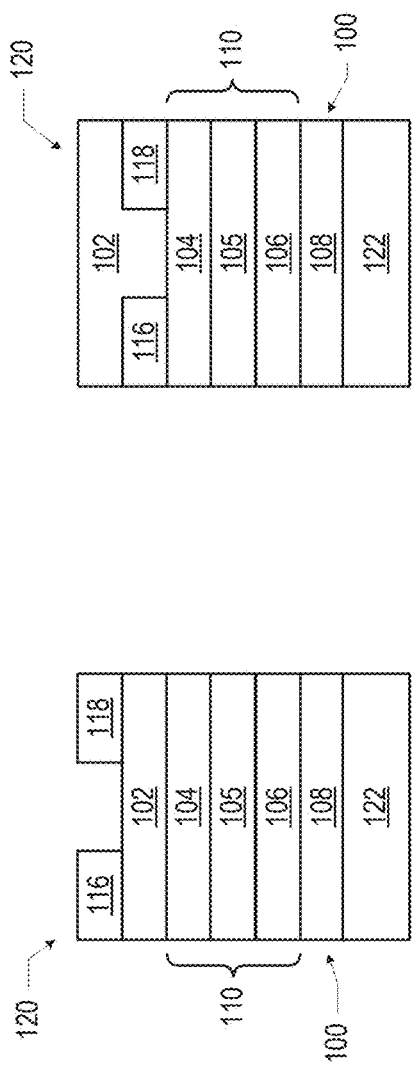
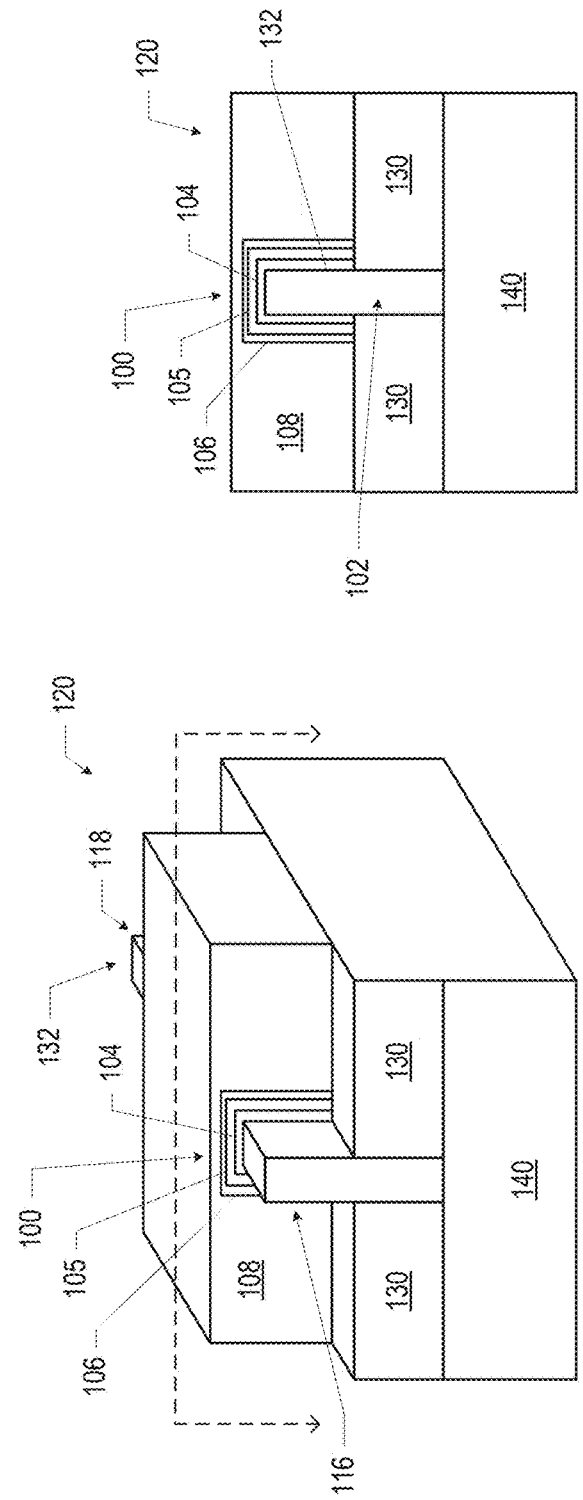

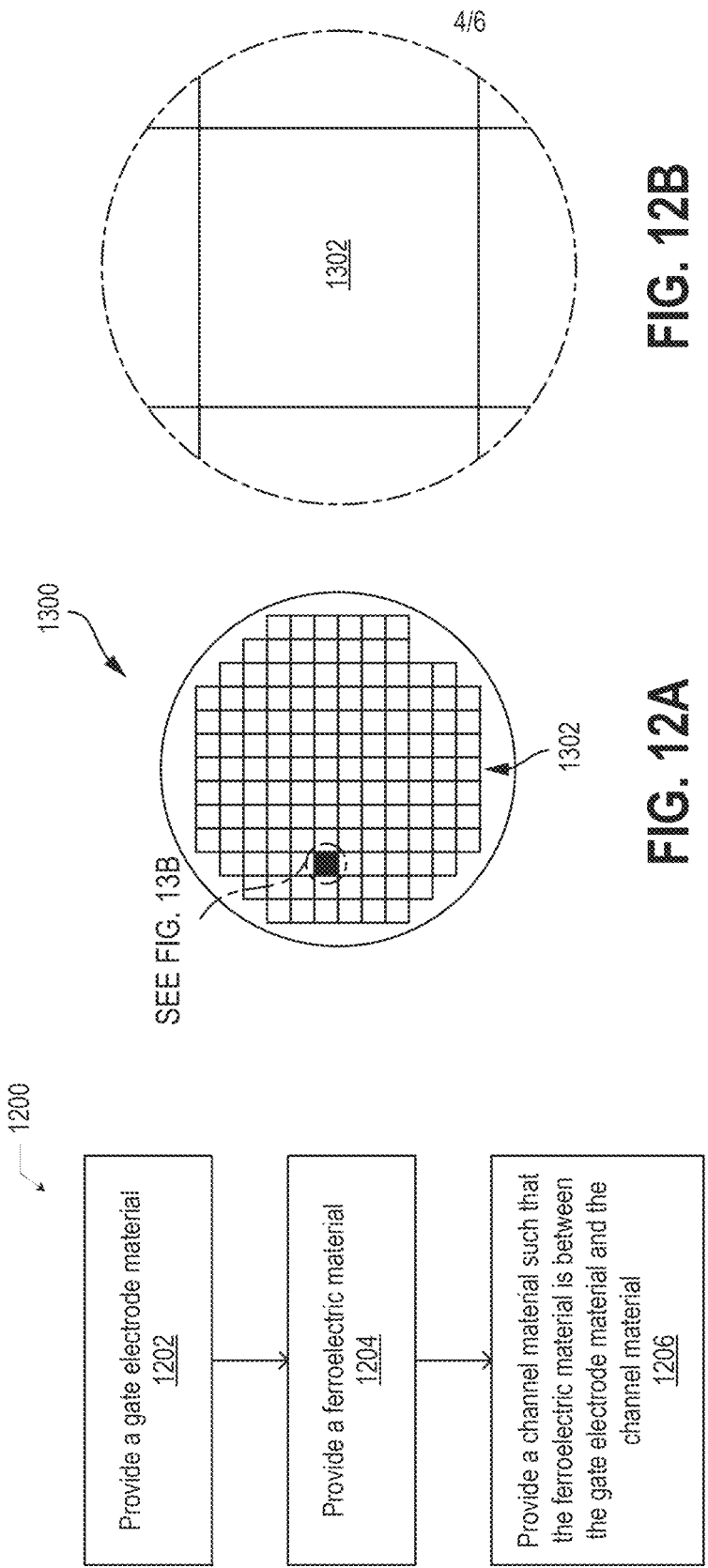

TRANSISTORS WITH FERROELECTRIC GATES

CROSS-REFERENCE TO RELATED APPLICATION

This application is a divisional of (and claims the benefit of priority under 35 U.S.C. § 120 to) U.S. patent application Ser. No. 16/142,940, filed Sep. 26, 2018, and entitled "TRANSISTORS WITH FERROELECTRIC GATES," which is hereby incorporated by reference herein in its entirety.

BACKGROUND

Conventional thin film transistors may include a gate oxide between a gate electrode and a semiconducting channel. The gate oxide may be, for example, a high-k dielectric material.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIG. 1 is a cross-sectional side view of a transistor gate-channel arrangement including a gate stack, in accordance with various embodiments.

FIGS. 2-5 are cross-sectional side views of example single-gate transistors including a gate stack, in accordance with various embodiments.

FIGS. 6-7 are cross-sectional side views of example double-gate transistors including a gate stack, in accordance with various embodiments.

FIGS. 8A and 8B are perspective and cross-sectional side views, respectively, of an example tri-gate transistor including a gate stack, in accordance with various embodiments.

FIG. 11 is a flow diagram of an example method of manufacturing a 1-transistor (1T) memory cell, in accordance with various embodiments.

FIGS. 12A and 12B are top views of a wafer and dies that include one or more gate stacks, in accordance with any of the embodiments disclosed herein.

DETAILED DESCRIPTION

Figure 9B:
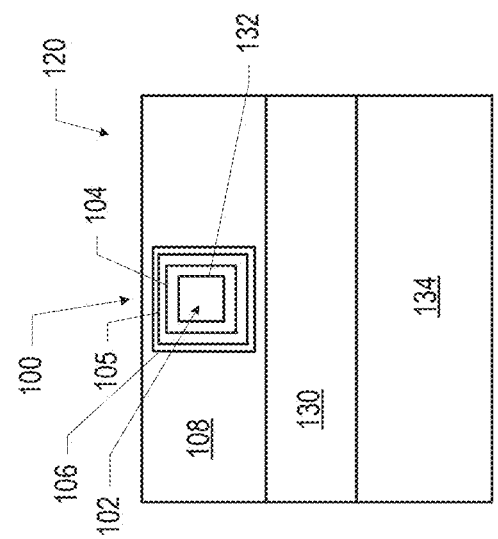
FIGS. 9A and 9B are perspective and cross-sectional side views, respectively, of an example gate-all-around transistor including a gate stack, in accordance with various embodiments.

Disclosed herein are transistors with ferroelectric gates, and related methods and devices. For example, in some embodiments, a transistor may include a channel material and a gate stack, and the gate stack may include a gate electrode material and a ferroelectric material between the gate electrode material and the channel material.

The transistors disclosed herein may exhibit polarization in the ferroelectric material during operation, shifting the current-voltage (I-V) characteristic (e.g., the threshold voltage) of the transistor depending upon the state of the polarization and thus allowing the transistor to be used as a memory device (e.g., a 1-transistor (1T) memory cell). For example, a "1" or "0" may be written to a 1T memory cell by appropriate control of the gate voltage, and this "1" or "0" may be read back by measuring the source/drain current at a specified gate voltage. Use of the transistors disclosed herein as 1T memory may simplify the manufacturing of memory devices relative to conventional dynamic random access memory (DRAM) by, for example, eliminating the need to fabricate a capacitor as required for a conventional 1-transistor/1-capacitor (1T1C) memory cell. Use of the transistors disclosed herein as 1T memory may also reduce the footprint and volume required per memory cell relative to conventional 1T1C designs, enabling higher memory density. For example, 1T memory cells utilizing the transistors disclosed herein may achieve a footprint of 4F2 (where F is the relevant feature size, such as one-half the wordline or bitline pitch), while 1T1C memory cells may have a footprint of 6F2. The transistors disclosed herein may be stacked in three-dimensional arrangements. Further, the transistors disclosed herein may be manufactured at relatively low temperatures, enabling their placement in the front-end or the back-end of a device, and thus making them suitable for use in embedded memory applications (e.g., embedded DRAM (eDRAM). Consequently, the transistors disclosed herein may enable low power, semi-non-volatile eDRAM. Performance of 1T memory cells using the transistors disclosed herein may also be improved relative to conventional memory devices; for example, the transistor designs disclosed herein may mitigate the subthreshold swing degradation (due to, e.g., the short channel effect) that has limited the performance of conventional 1T1C designs.

In the following detailed description, reference is made to the accompanying drawings that form a part hereof, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. As used herein, a "high-k dielectric" refers to a material having a higher dielectric constant than silicon oxide.

FIG. 1 is a cross-sectional side view of a transistor gate-channel arrangement 101 including a channel material 102 and a gate stack 100, in accordance with various embodiments. The gate stack 100 may include a gate electrode material 108 and a ferroelectric material stack 110, with the ferroelectric material stack 110 disposed between the gate electrode material 108 and the channel material 102.

The channel material 102 may be composed of semiconductor material systems including, for example, n-type or p-type materials systems. In some embodiments, the channel material 102 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, strontium oxide, or tungsten oxide. In some embodiments, the channel material 102 may include indium gallium zinc oxide (IGZO). In some embodiments, the channel material 102 may be a single-crystal semiconductor material, such as single-crystal silicon or single-crystal germanium. In some embodiments, the channel material 102 may have a bandgap that is greater than 1.3 electron-volts; such embodiments may allow a transistor including the transistor gate-channel arrangement 101 to exhibit lower leakage in the "off" state, yielding a larger signal-to-noise ratio and thus improved performance. In some embodiments, the channel material 102 may include a metal. The channel material 102 may have a thickness 113. In some embodiments, the thickness 113 may be between 5 nanometers and 30 nanometers.

The gate electrode material 108 may include at least one p-type work function metal or n-type work function metal, depending on whether the transistor gate-channel arrangement 101 is to be part of a p-type metal oxide semiconductor (PMOS) or an n-type metal oxide semiconductor (NMOS) transistor. In some implementations, the gate electrode material 108 may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode material 108 include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode material 108 include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning). In some embodiments, the gate electrode material 108 may include a nitride material, such as titanium nitride, tantalum nitride, tungsten nitride, or tantalum carbonitride.

The ferroelectric material stack 110 may include a first intermediate material 104, a ferroelectric material 105, and a second intermediate material 106, arranged in the gate stack 100 so that the first intermediate material 104 is between the channel material 102 and the ferroelectric material 105, the ferroelectric material 105 is between the first intermediate material 104 and the second intermediate material 106, and the second intermediate material 106 is between the ferroelectric material 105 and the gate electrode material 108. Although the first intermediate material 104 and the second intermediate material 106 are shown in various ones of the accompanying figures as part of the ferroelectric material stack 110, the first intermediate material 104 and/or the second intermediate material 106 may not be included in the ferroelectric material stack 110 in some embodiments. In particular, for each embodiment in which the first intermediate material 104 is depicted as part of the ferroelectric material stack 110, there exists a corresponding embodiment in which the first intermediate material 104 is absent (and the ferroelectric material 105 is in contact with the channel material 102). Similarly, for each embodiment in which the second intermediate material 106 is depicted as part of the ferroelectric material stack 110, there exists a corresponding embodiment in which the second intermediate material 106 is absent (and the ferroelectric material 105 is in contact with the gate electrode material 108).

The ferroelectric material 105 may be any suitable material that exhibits a spontaneous electric polarization that may be induced and reversed by an applied electric field. This polarization may result in excess charge at the faces of the ferroelectric material 105, and the materials proximate to these faces may compensate by providing or removing electrons, and the electrical properties of the transistor gate-channel arrangement 101 may change accordingly. For example, in embodiments in which the transistor gate-channel arrangement 101 is part of an NMOS transistor, when positive charge accumulates at the face of the ferroelectric material 105 closest to the channel material 102 (with or without an intervening first intermediate material 104), the threshold voltage of the transistor will decrease; when negative charge accumulates at the face of the ferroelectric material 105 closest to the channel material 102 (with or without an intervening first intermediate material 104), the threshold voltage of the transistor will increase. Similarly, in embodiments in which the transistor gate-channel arrangement 101 is part of an PMOS transistor, when negative charge accumulates at the face of the ferroelectric material 105 closest to the channel material 102 (with or without an intervening first intermediate material 104), the threshold voltage of the transistor will decrease; when positive charge accumulates at the face of the ferroelectric material 105 closest to the channel material 102 (with or without an intervening first intermediate material 104), the threshold voltage of the transistor will increase.

In some embodiments, the ferroelectric material 105 may include hafnium zirconium oxide, hafnium silicon oxide, hafnium aluminum oxide, hafnium yttrium oxide, hafnium lanthanum oxide, hafnium nickel oxide, or hafnium cobalt oxide. In some embodiments in which the ferroelectric material 105 includes hafnium zirconium oxide ($Hf_xZr_{1-x}O_2$), the hafnium content x may range from 0 to 1. In some embodiments, the ferroelectric material 105 may be hafnium. In some embodiments, the ferroelectric material 105 may include hafnium nitride, hafnium zirconium nitride, hafnium silicon nitride, hafnium aluminum nitride, hafnium yttrium nitride, hafnium lanthanum nitride, hafnium nickel nitride, or hafnium cobalt nitride. In some embodiments, the ferroelectric material 105 may include hafnium oxide nitride, hafnium zirconium oxide nitride, hafnium silicon oxide nitride, hafnium aluminum oxide nitride, hafnium yttrium oxide nitride, hafnium lanthanum oxide nitride, hafnium nickel oxide nitride, or hafnium cobalt oxide nitride.

In some embodiments, the ferroelectric material 105 may be a perovskite material. For example, the ferroelectric material 105 may include lead zirconium titanate, bismuth ferrite, lanthanum strontium manganate, or other complex oxides. The ferroelectric material 105 may also include any combination of the ferroelectric materials disclosed herein. The ferroelectric material 105 may have a thickness 111. In some embodiments, the thickness 111 may be between 2 nanometers and 20 nanometers.

Figure 10:
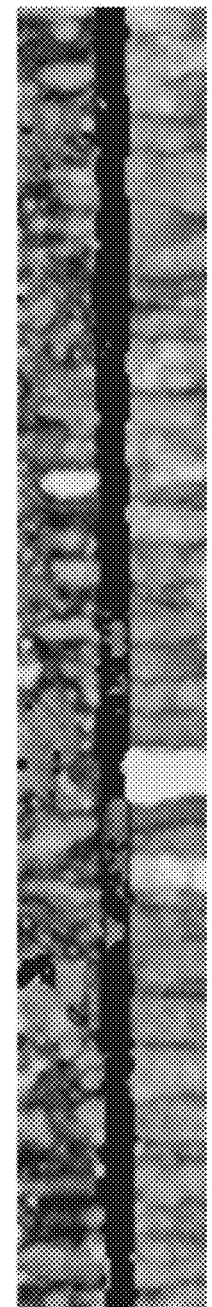
FIG. 10 is a cross-sectional side view of a ferroelectric material having an orthorhombic crystal lattice, in accordance with various embodiments.

The ferroelectric material 105 may have an orthorhombic crystal lattice (one in which all three mutually perpendicular axes of the unit cell are different in length) in at least some of its volume. In some embodiments, at least 20% of crystals of the ferroelectric material 105 are arranged in an orthorhombic crystal lattice; such embodiments may exhibit adequate ferroelectricity during operation. For example, FIG. 10 illustrates an example transistor gate-channel arrangement having a ferroelectric material 105 between a gate electrode material 108 and a channel material 102. The dark portions of the ferroelectric material 105 are those with an orthorhombic crystal lattice (identified, for example, by x-ray diffraction (XRD)), while the lighter portions of the ferroelectric material 105 are those with a monoclinic (or other) crystal lattice structure. The ferroelectric material 105 of FIG. 10 may be an example of a ferroelectric material 105 having at least 20% of crystals arranged in an orthorhombic crystal lattice.

In some embodiments in which the first intermediate material 104 is absent from the ferroelectric material stack 110, at least some of the grains of the ferroelectric material 105 (e.g., the crystals of the ferroelectric material 105 at the face of the ferroelectric material 105 that is in contact with the channel material 102) may be aligned with the grains of the channel material 102. For example, in some embodiments in which the ferroelectric material 105 is in contact with the channel material 102, at least 5% of crystals of the ferroelectric material 105 may have a grain orientation that is aligned with a grain orientation of the channel material 102 (a property which may be determined by XRD, for example). This matched orientation may extend partially into the thickness of the ferroelectric material 105 from the interface between the ferroelectric material 105 and the channel material 102, or through the full thickness of the ferroelectric material 105. In some embodiments in which the second intermediate material 106 is absent from the ferroelectric material stack 110, at least some of the grains of the ferroelectric material 105 (e.g., the crystals of the ferroelectric material 105 at the face of the ferroelectric material 105 that is in contact with the gate electrode material 108) may be aligned with the grains of the gate electrode material 108. For example, in some embodiments in which the ferroelectric material 105 is in contact with the gate electrode material 108, at least 5% of crystals of the ferroelectric material 105 may have a grain orientation that is aligned with a grain orientation of the gate electrode material 108. This matched orientation may extend partially into the thickness of the ferroelectric material 105 from the interface between the ferroelectric material 105 and the gate electrode material 108, or through the full thickness of the ferroelectric material 105. These properties may differentiate some embodiments of the ferroelectric material 105 from some conventional gate dielectric materials in which there is no correspondence between the grain orientation of the gate dielectric materials and the adjacent channel and gate electrode materials.

In some embodiments, the first intermediate material 104, when present, may be a high-k dielectric. For example, the first intermediate material 104 may include elements such as hafnium, silicon, oxygen, titanium, tantalum, lanthanum, aluminum, zirconium, barium, strontium, yttrium, lead, scandium, niobium, and zinc. Examples of high-k materials that may be used in the first intermediate material 104 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, the first intermediate material 104 may be a metal, such as titanium. The first intermediate material 104 may have a thickness 112. In some embodiments, the thickness 112 may be between 1 nanometer and 3 nanometers (e.g., between 1 nanometer and 2 nanometers). In some embodiments, the first intermediate material 104, when present, may act as a depolarization layer to mitigate the effects of the electric field in the ferroelectric material 105 on the channel material 102.

The second intermediate material 106, when present, may act as an adhesion layer to improve mechanical coupling between the ferroelectric material 105 and the gate electrode material 108. For example, if the gate electrode material 108 includes platinum, and the ferroelectric material 105 includes hafnium oxide, it may be difficult to grow the ferroelectric material 105 directly on the gate electrode material 108; in such embodiments, the use of a second intermediate material 106 like aluminum oxide (which will grow on platinum, and on which hafnium oxide will grow) may aid in fabrication. The second intermediate material 106 may have at thickness 114. In some embodiments, the thickness 114 may be between one monolayer of the second intermediate material 106 and 5 nanometers.

The ferroelectric material stack 110 may be formed using a low-temperature deposition process, such as physical vapor deposition (PVD) (e.g., sputtering), atomic layer deposition (ALD), or chemical vapor deposition (CVD). The ability to deposit the ferroelectric material stack 110 at temperatures low enough to be compatible with back-end manufacturing processes represents a particular advantage. The ferroelectric material stack 110 may be deposited on sidewalls or conformably on any desired structure to a precise thickness, allowing the manufacture of transistors having any desired geometry.

Figure 9A:
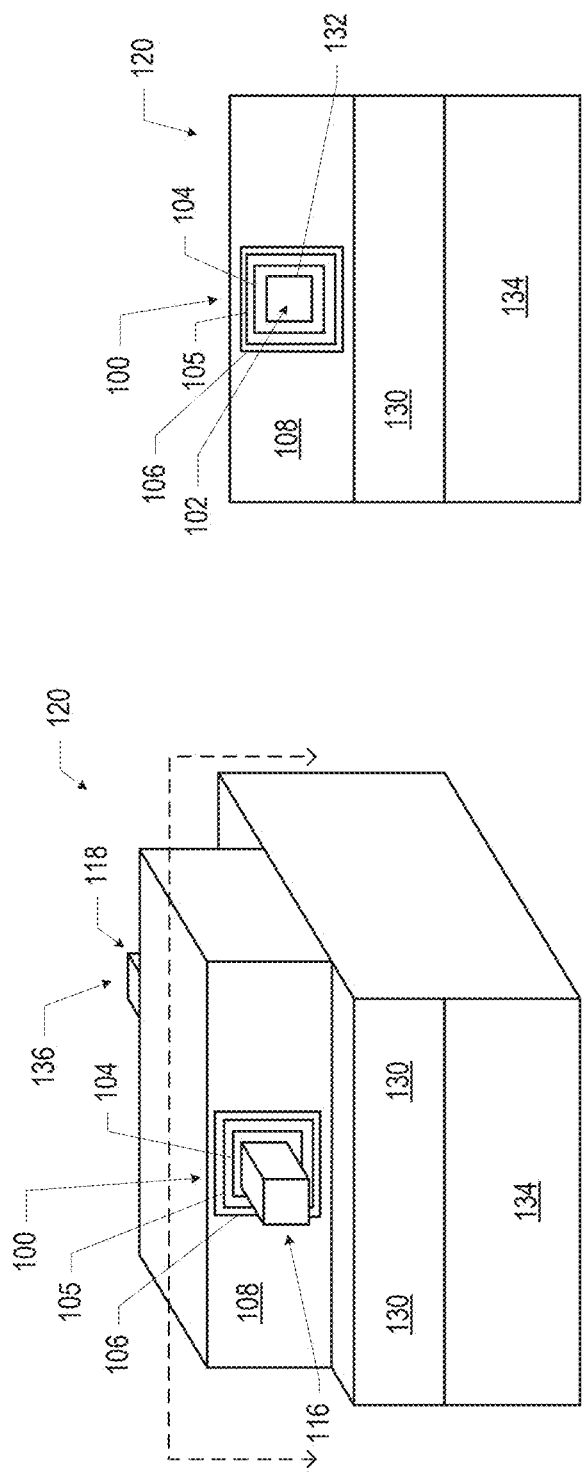

The gate stack 100 may be included in any suitable transistor structure. For example, FIGS. 2-5 are cross-sectional side views of example single-gate transistors 120 including a gate stack 100, FIGS. 6-7 are cross-sectional side views of example double-gate transistors 120 including a gate stack 100, FIGS. 8A and 8B are perspective and cross-sectional side views, respectively, of an example tri-gate transistor 120 including a gate stack, and FIGS. 9A and 9B are perspective and cross-sectional side views, respectively, of an example gate-all-around transistor 120 including a gate stack, in accordance with various embodiments. The transistors 120 illustrated in FIGS. 2-9 do not represent an exhaustive set of transistor structures in which a gate stack 100 may be included, but may provide examples of such structures. Although particular arrangements of materials are discussed below with reference to FIGS. 2-9, the first and second intermediate materials 104 and 106, respectively, may be omitted from the gate stacks 100 of the transistors 120, as discussed above with reference to FIG. 1. Note that FIGS. 2-5 are intended to show relative arrangements of the components therein, and that transistors 120 may include other components that are not illustrated (e.g., electrical contacts to the source region 116 and the drain region 118 to transport current in and out of the transistors 120). Any of the components of the transistors 120 discussed below with reference to FIGS. 2-9 may take the form of any of the embodiments of those components discussed above with reference to FIG. 1. Additionally, although various components of the transistors 120 are illustrated in FIGS. 2-9 as being planar rectangles or formed of rectangular solids, this is simply for ease of illustration, and embodiments of these transistors 120 may be curved, rounded, or otherwise irregularly shaped as dictated by the manufacturing processes used to fabricate the transistors 120.

FIG. 2 depicts a transistor 120 including a gate stack 100 and having a single "top" gate provided by the gate electrode material 108 and the ferroelectric material stack 110 (which includes the ferroelectric material 105). The ferroelectric material stack 110 may be disposed between the gate electrode material 108 and the channel material 102. The ferroelectric material stack 110 may border the channel material 102. In the embodiment of FIG. 2, the gate stack 100 is shown as disposed on a substrate 122. The substrate 122 may be any structure on which the gate stack 100, or other elements of the transistor 120, is disposed. In some embodiments, the substrate 122 may include a semiconductor, such as silicon. In some embodiments, the substrate 122 may include an insulating layer, such as an oxide isolation layer. For example, in the embodiments of FIGS. 2 and 3, the substrate 122 may include a semiconductor material and an interlayer dielectric (ILD) disposed between the semiconductor material and the source region 116, the channel material 102, and the drain region 118, to electrically isolate the semiconductor material of the substrate 122 from the source region 116, the channel material 102, and the drain region 118 (and thereby mitigate the likelihood that a conductive pathway will form between the source region 116 and the drain region 118 through the substrate 122). Examples of ILDs that may be included in a substrate 122 in some embodiments may include silicon oxide, silicon nitride, aluminum oxide, and/or silicon oxynitride. Any suitable ones of the embodiments of the substrate 122 described with reference to FIG. 2 may be used for the substrates 122 of others of the transistors 120 disclosed herein.

As noted above, the transistor 120 may include a source region 116 and a drain region 118 disposed on the substrate 122, with the channel material 102 disposed between the source region 116 and the drain region 118 so that at least some of the channel material 102 is coplanar with at least some of the source region 116 and the drain region 118. The source region 116 and the drain region 118 may have a thickness 124, and the channel material 102 may have a thickness 126. The thickness 126 may take the form of any of the embodiments of the thickness 113 discussed above with reference to FIG. 1. In some embodiments, the thickness 124 may be less than the thickness 126 (as illustrated in FIG. 2, with the source region 116 and the drain region 118 each disposed between some of the channel material 102 and the substrate 122), while in other embodiments, the thickness 124 may be equal to the thickness 126. In some embodiments, the channel material 102, the ferroelectric material stack 110, and/or the gate electrode material 108 may conform around the source region 116 and/or the drain region 118. The source region 116 and the drain region 118 may be spaced apart by a distance 125 that is the gate length of the transistor 120. In some embodiments, the gate length may be between 20 nanometers and 30 nanometers (e.g., between 22 nanometers and 28 nanometers, or approximately 25 nanometers).

The source region 116 and the drain region 118 may be formed using any suitable processes known in the art. For example, one or more layers of metal and/or metal alloys may be deposited or otherwise provided to form the source region 116 and the drain region 118, as known for thin film transistors based on semiconductor oxide systems. Any suitable ones of the embodiments of the source region 116 and the drain region 118 described above may be used for any of the source regions 116 and drain regions 118 described herein.

FIG. 3 depicts a transistor 120 including a gate stack 100 and having a single "top" gate provided by the gate electrode material 108 and the ferroelectric material stack 110 (which includes the ferroelectric material 105). The ferroelectric material stack 110 may be disposed between the gate electrode material 108 and the channel material 102. The ferroelectric material stack 110 may border the channel material 102. In the embodiment of FIG. 3, the gate stack 100 is shown as disposed on a substrate 122. The transistor 120 may include a source region 116 and a drain region 118 disposed on the substrate 122, with the first intermediate material 104 disposed between the source region 116 and the drain region 118 so that at least some of the first intermediate material 104 is coplanar with at least some of the source region 116 and the drain region 118. In some embodiments, at least some of the ferroelectric material 105 may be disposed between the source region 116 and the drain region 118 so that at least some of the ferroelectric material 105 is coplanar with at least some of the source region 116 and the drain region 118 (e.g., instead of, or in addition to, the first intermediate material 104). As discussed above, in some embodiments, the substrate 122 of FIG. 3 may include a semiconductor material and ILD disposed between the semiconductor material and the source region 116, the channel material 102, and the drain region 118, to electrically isolate the semiconductor material of the substrate 122 from the source region 116, the channel material 102, and the drain region 118. In some embodiments, the ferroelectric material stack 110 and/or the gate electrode material 108 may conform around the source region 116 and/or the drain region 118.

FIG. 4 depicts a transistor 120 including a gate stack 100 and having a single "bottom" gate provided by the gate electrode material 108 and the ferroelectric material stack 110 (which includes the ferroelectric material 105). The ferroelectric material stack 110 may be disposed between the gate electrode material 108 and the channel material 102. The ferroelectric material stack 110 may border the channel material 102. In the embodiment of FIG. 4, the gate stack 100 is shown as disposed on a substrate 122 in an orientation "upside down" to the one illustrated in FIG. 2; that is, the gate electrode material 108 may be disposed between the substrate 122 and the channel material 102. The transistor 120 may include a source region 116 and a drain region 118 disposed on the channel material 102 such that the source region 116 and the drain region 118 are not coplanar with the channel material 102.

FIG. 5 depicts a transistor 120 including a gate stack 100 and having a single "bottom" gate provided by the gate electrode material 108 and the ferroelectric material stack 110 (which includes the ferroelectric material 105). The ferroelectric material stack 110 may be disposed between the gate electrode material 108 and the channel material 102. The ferroelectric material stack 110 may border the channel material 102. In the embodiment of FIG. 5, the gate stack 100 is shown as disposed on a substrate 122 in an orientation "upside down" to the one illustrated in FIG. 2; that is, the gate electrode material 108 may be disposed between the substrate 122 and the channel material 102. The transistor 120 may include a source region 116 and a drain region 118 disposed on the channel material 102 such that at least some of the source region 116 and at least some of the drain region 118 are coplanar with at least some of the channel material 102. In some embodiments, the source region 116 and the drain region 118 may each be disposed between some of the channel material 102 and the substrate 122, as illustrated in FIG. 5, while in other embodiments, the channel material 102 may not extend "above" the source region 116 or the drain region 118. In some embodiments, the channel material 102 may conform around the source region 116 and/or the drain region 118. The transistors 120 of FIGS. 2-3 may be referred to as "top-gated" transistors, and the transistors 120 of FIGS. 4-5 may be referred to as "bottom-gated" transistors.

FIG. 6 depicts a double-gate transistor 120 including two gate stacks 100-1 and 100-2 and having "bottom" and "top" gates provided by the gate electrode material 108-1/ferroelectric material stack 110-1 and the gate electrode material 108-2/ferroelectric material stack 110-2, respectively. The ferroelectric material stacks 110-1 and 110-2 may include a first intermediate material 104-1 and 104-2, a ferroelectric material 105-1 and 105-2, and a second intermediate material 106-1 and 106-2, respectively. Each ferroelectric material stack 110 may be disposed between the corresponding gate electrode material 108 and the channel material 102. Each ferroelectric material stack 110 may border the channel material 102. The transistor 120 may include a source region 116 and a drain region 118 disposed proximate to the channel material 102. In the embodiment illustrated in FIG. 6, the source region 116 and the drain region 118 are disposed on the ferroelectric material 105-2, and the second intermediate material 106-2 is disposed conformally around the source region 116, the ferroelectric material 105-2, and the drain region 118. This particular arrangement is simply illustrative, and the ferroelectric material stack 110-2 may be arranged in other ways relative to the gate electrode material 108-2, the source region 116, the drain region 118, and the channel material 102.

FIG. 7 depicts a double-gate transistor 120 including two gate stacks 100-1 and 100-2 and having "bottom" and "top" gates provided by the gate electrode material 108-1/ferroelectric material stack 110-1 and the gate electrode material 108-2/ferroelectric material stack 110-2, respectively. Each ferroelectric material stack 110 may include a ferroelectric material 105. Each ferroelectric material stack 110 may be disposed between the corresponding gate electrode material 108 and the channel material 102. Each ferroelectric material stack 110 may border the channel material 102. The transistor 120 may include a source region 116 and a drain region 118 disposed proximate to the channel material 102. In the embodiment illustrated in FIG. 7, the source region 116 and the drain region 118 are coplanar with the channel material 102. The relative arrangement of the source region 116, the drain region 118, and the channel material 102 may take the form of any of the embodiments discussed above with reference to FIG. 2.

FIGS. 8A and 8B are perspective and cross-sectional side views, respectively, of an example tri-gate transistor 120 including a gate stack 100, in accordance with various embodiments. The transistor 120 of FIGS. 8A and 8B may include a channel material 102, and a gate stack 100 including a gate electrode material 108 and a ferroelectric material stack 110. In the tri-gate transistor 120 illustrated in FIGS. 8A and 8B, a fin 132 formed of a semiconductor material may extend from a base 140 of the semiconductor material. An oxide material 130 may be disposed on either side of the fin 132. In some embodiments, the oxide material 130 may include any of the high-k dielectric materials discussed herein.

The gate stack 100 may wrap around the fin 132 as shown, with the channel material 102 corresponding to the portion of the fin 132 wrapped by the gate stack 100. In particular, the first intermediate material 104 (when present), the ferroelectric material 105, and the second intermediate material 106 (when present) may wrap around the channel material 102 of the fin 1032, and the gate electrode material 108 may wrap around the ferroelectric material stack 110. The fin 132 may include a source region 116 and a drain region 118 on either side of the gate stack 100, as shown. The composition of the channel material 102, the source region 116, and a drain region 118 may take the form of any of the embodiments disclosed herein, or known in the art. Although the fin 132 illustrated in FIGS. 8A and 8B is shown as having a rectangular cross section, the fin 132 may instead have a cross section that is rounded or sloped at the "top" of the fin 132, and the gate stack 100 may conform to this rounded or sloped fin 132. In use, the tri-gate transistor 120 may form conducting channels on three "sides" of the fin 132, potentially improving performance relative to single-gate transistors (which may form conducting channels on one "side" of the channel material 102) and double-gate transistors (which may form conducting channels on two "sides" of the channel material 102).

FIGS. 9A and 9B are perspective and cross-sectional side views, respectively, of an example gate-all-around transistor 120 including a gate stack 100, in accordance with various embodiments. The transistor 120 of FIGS. 9A and 9B may include a channel material 102, and a gate stack 100 including a gate electrode material 108 and a ferroelectric material stack 110. In the gate-all-around transistor 120 illustrated in FIGS. 9A and 9B, a wire 136 formed of a semiconductor material may extend above a substrate 134 and a layer of oxide material 130. The wire 136 may take the form of a nanowire or nanoribbon, for example. The gate stack 100 may wrap entirely or almost entirely around the wire 136, as shown, with the channel material 102 corresponding to the portion of the wire 136 wrapped by the gate stack 100. In particular, the ferroelectric material stack 110 and the gate electrode material 108 may wrap around the channel material 102. In some embodiments, the gate stack 100 may fully encircle the wire 136. The wire 136 may include a source region 116 and a drain region 118 on either side of the gate stack 100, as shown. The composition of the channel material 102, the source region 116, and a drain region 118 may take the form of any of the embodiments disclosed herein, or known in the art.

Although the wire 136 illustrated in FIGS. 9A and 9B is shown as having a rectangular cross section, the wire 136 may instead have a cross section that is rounded or otherwise irregularly shaped, and the gate stack 100 may conform to the shape of the wire 136. In use, the gate-all-around transistor 120 may form conducting channels on more than three "sides" of the wire 136, potentially improving performance relative to tri-gate transistors. Although FIGS. 9A and 9B depict an embodiment in which the longitudinal axis of the wire 136 runs substantially parallel to a plane of the oxide material 130 (and a plane of the substrate 134), this need not be the case; in other embodiments, for example, the wire 136 may be oriented "vertically" so as to be perpendicular to a plane of the oxide material 130 (or plane of the substrate 134); in such embodiments, the gate-all-around transistors 120 may be stacked vertically (e.g., as part of a three-dimensional array of transistors 120).

The transistor gate-channel arrangements 101 disclosed herein may be manufactured using any suitable techniques. For example, FIG. 11 is a flow diagram of an example method 1200 of manufacturing a 1T memory cell, in accordance with various embodiments. Although the operations of the method 1200 are illustrated once each and in a particular order, the operations may be performed in any suitable order and repeated as desired. For example, one or more operations may be performed in parallel to manufacture multiple 1T memory cells substantially simultaneously. In another example, the operations may be performed in a different order to reflect the structure of a transistor in which the gate stack will be included (e.g., the gate electrode material 108 of the transistor 120 of FIG. 5 may be provided before the ferroelectric material 105, while the gate electrode material 108 of the transistor 120 of FIG. 8 may be provided after the ferroelectric material 105).

At 1202, a gate electrode material may be provided. The gate electrode material provided at 1202 may take the form of any of the embodiments of the gate electrode material 108 disclosed herein, for example (e.g., any of the embodiments discussed herein with reference to a transistor 120). The gate electrode material may be provided at 1202 using any suitable deposition and patterning technique known in the art.

At 1204, a ferroelectric material may be provided. The ferroelectric material provided at 1204 may take the form of any of the embodiments of the ferroelectric material 105 disclosed herein, for example. In some embodiments, the ferroelectric material may be provided at 1204 so as to be in contact with the gate electrode material of 1202. In other embodiments, an intermediate material may be disposed between the gate electrode material and the ferroelectric material. The ferroelectric material may be provided at 1204 using any suitable technique known in the art. For example, in some embodiments, the ferroelectric material may be provided by PVD, such as sputtering. In some embodiments, the ferroelectric material may be provided by ALD. In some embodiments, the ferroelectric material may be provided by CVD.

At 1206, a channel material may be provided such that the ferroelectric material is disposed between the channel material and the gate electrode material. The channel material provided at 1206 may take the form of any of the embodiments of the channel material 102 disclosed herein. In some embodiments, the ferroelectric material provided at 1206 may be in contact with the channel material provided as 1206, while in other embodiments, an intermediate material may be disposed between the ferroelectric material and the channel material. The channel material 102 may be provided at 1206 using any suitable technique known in the art.

The method 1200 may further include other manufacturing operations related to fabrication of other components of a transistor 120. For example, the method 1200 may include providing a source region and a drain region (e.g., in accordance with any suitable ones of the embodiments discussed above), forming conductive contacts to the source region, drain region, and gate electrode, forming bitlines and/or wordlines to selectively couple different ones of the transistors 120 together, etc.

The gate stacks 100, transistor gate-channel arrangements 101, and transistors 120 disclosed herein may be included in any suitable electronic device. FIGS. 12-15 illustrate various examples of apparatuses that may include one or more of the gate stacks disclosed herein.

FIGS. 12A-B are top views of a wafer 1300 and dies 1302 that may include one or more gate stacks in accordance with any of the embodiments disclosed herein. The wafer 1300 may be composed of semiconductor material and may include one or more dies 1302 having IC structures formed on a surface of the wafer 1300. Each of the dies 1302 may be a repeating unit of a semiconductor product that includes any suitable IC (e.g., ICs including one or more transistors 120 that include one or more gate stacks 100). After the fabrication of the semiconductor product is complete (e.g., after manufacture of a gate stack 100 in a transistor 120), the wafer 1300 may undergo a singulation process in which the dies 1302 are separated from one another to provide discrete "chips" of the semiconductor product. In particular, devices that include a gate stack as disclosed herein may take the form of the wafer 1300 (e.g., not singulated) or the form of the die 1302 (e.g., singulated). The die 1302 may include one or more transistors (e.g., one or more of the transistors 1440 of FIG. 13, discussed below, which may take the form of any of the transistors 120) and/or supporting circuitry to route electrical signals to the transistors, as well as any other IC components. In some embodiments, the wafer 1300 or the die 1302 may include a memory device (e.g., a static random access memory (SRAM) device), a logic device (e.g., an AND, OR, NAND, or NOR gate), or any other suitable circuit element. Multiple ones of these devices may be combined on a single die 1302. For example, a memory array formed by multiple memory devices may be formed on a same die 1302 as a processing device (e.g., the processing device 1602 of FIG. 15) or other logic that is configured to store information in the memory devices or execute instructions stored in the memory array.

Figure 13:
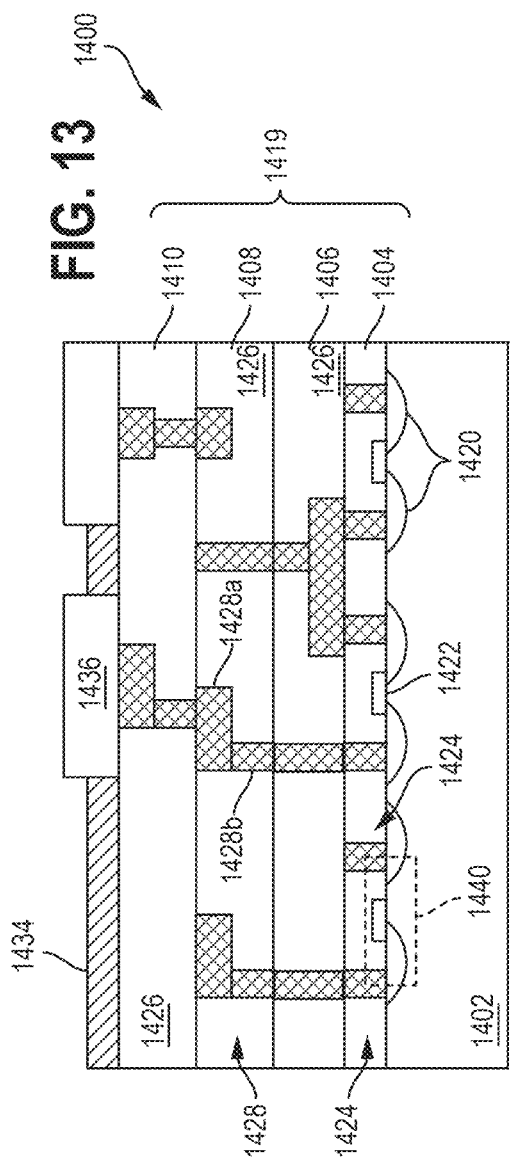
FIG. 13 is a cross-sectional side view of an integrated circuit (IC) device that may include one or more gate stacks, in accordance with any of the embodiments disclosed herein.

FIG. 13 is a cross-sectional side view of an IC device 1400 that may include one or more gate stacks in accordance with any of the embodiments disclosed herein. The IC device 1400 may be formed on a substrate 1402 (e.g., the wafer 1300 of FIG. 12A) and may be included in a die (e.g., the die 1302 of FIG. 12B). The substrate 1402 may be a semiconductor substrate composed of semiconductor material systems including, for example, n-type or p-type materials systems. The substrate 1402 may include, for example, a crystalline substrate formed using a bulk silicon or a silicon-on-insulator substructure. In some embodiments, the substrate 1402 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the substrate 1402. Although a few examples of materials from which the substrate 1402 may be formed are described here, any material that may serve as a foundation for an IC device 1400 may be used. The substrate 1402 may be part of a singulated die (e.g., the dies 1302 of FIG. 12B) or a wafer (e.g., the wafer 1300 of FIG. 12A).

The IC device 1400 may include one or more device layers 1404 disposed on the substrate 1402. The device layer 1404 may include features of one or more transistors 1440 (e.g., metal oxide semiconductor field-effect transistors (MOSFETs) formed on the substrate 1402. The device layer 1404 may include, for example, one or more source and/or drain (S/D) regions 1420, a gate 1422 to control current flow in the transistors 1440 between the S/D regions 1420, and one or more S/D contacts 1424 to route electrical signals to/from the S/D regions 1420. The transistors 1440 may include additional features not depicted for the sake of clarity, such as device isolation regions, gate contacts, and the like. The transistors 1440 are not limited to the type and configuration depicted in FIG. 13 and may include a wide variety of other types and configurations such as, for example, planar transistors, non-planar transistors, or a combination of both. Non-planar transistors may include FinFET transistors, such as double-gate transistors or tri-gate transistors, and wrap-around gate or gate-all-around transistors, such as nanoribbon and nanowire transistors. In particular, one or more of the transistors 1440 may include one or more gate stacks 100 in accordance with any of the embodiments disclosed herein. For example, a transistor 1440 may take the form of any of the transistors 120 disclosed herein (e.g., any of the single-gate transistors discussed herein with reference to FIGS. 2-5, any of the double-gate transistors discussed herein with reference to FIGS. 6-7, any of the tri-gate transistors discussed herein with reference to FIGS. 8A and 8B, and any of the gate-all-around transistors discussed herein with reference to FIGS. 9A and 9B). The S/D regions 1420 may include the source region 116 and the drain region 118. Thin film transistors 120 including the gate stack 100 may be particularly advantageous when used in the metal layers of a microprocessor device for analog circuitry, logic circuitry, or memory circuitry, and may be formed along with existing complementary metal oxide semiconductor (CMOS) processes. A transistor 120 included in a device layer 1404 may be referred to as a "front-end" device. In some embodiments, the IC device 1400 may not include any front-end transistors 120. One or more transistors 120 in the device layer 1404 may be coupled to any suitable other ones of the devices in the device layer 1404, to any devices in the metallization stack 1419 (discussed below), and/or to one or more of the conductive contacts 1436 (discussed below). Other types of transistors 1440 are discussed below.

Each transistor 1440 may include a gate 1422 formed of at least two layers, a gate dielectric layer and a gate electrode layer. The gate electrode layer may take the form of any of the embodiments of the gate electrode material 108 disclosed herein. In embodiments in which a transistor 1440 includes one or more gate stacks 100, the gate dielectric layer may be replaced by a ferroelectric material stack 110. Generally, the gate dielectric layer of a transistor 1440 may include one layer or a stack of layers, and the one or more layers may include silicon oxide, silicon dioxide, and/or a high-k dielectric material. The high-k dielectric material included in the gate dielectric layer of the transistor 1440 may take the form of any of the embodiments of the high-k dielectrics disclosed herein, for example.

In some embodiments, when viewed as a cross section of the transistor 1440 along the source-channel-drain direction, the gate electrode may consist of a U-shaped structure that includes a bottom portion substantially parallel to the surface of the substrate and two sidewall portions that are substantially perpendicular to the top surface of the substrate (e.g., as discussed above with reference to the tri-gate transistor 120 of FIGS. 8A and 8B). In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers. In some embodiments, the gate electrode may consist of a V-shaped structure (e.g., when the fin 132 does not have a "flat" upper surface, but instead has a rounded peak).

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1420 may be formed within the substrate 1402 adjacent to the gate 1422 of each transistor 1440. The S/D regions 1420 may take the form of any of the embodiments of the source region 116 and the drain region 118 discussed above with reference to the transistors 120. In other embodiments, the S/D regions 1420 may be formed using any suitable processes known in the art. For example, the S/D regions 1420 may be formed using either an implantation/diffusion process or a deposition process. In the former process, dopants such as boron, aluminum, antimony, phosphorous, or arsenic may be ion-implanted into the substrate 1402 to form the S/D regions 1420. An annealing process that activates the dopants and causes them to diffuse farther into the substrate 1402 may follow the ion implantation process. In the latter process, an epitaxial deposition process may provide material that is used to fabricate the S/D regions 1420. In some implementations, the S/D regions 1420 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1420 may be formed using one or more alternate semiconductor materials such as germanium or a group III-V material or alloy. In further embodiments, one or more layers of metal and/or metal alloys may be used to form the S/D regions 1420 (e.g., as discussed above with reference to the source region 116 and the drain region 118). In some embodiments, an etch process may be performed before the epitaxial deposition to create recesses in the substrate 1402 in which the material for the S/D regions 1420 is deposited.

Electrical signals, such as power and/or input/output (I/O) signals, may be routed to and/or from the transistors 1440 of the device layer 1404 through one or more interconnect layers disposed on the device layer 1404 (illustrated in FIG. 13 as interconnect layers 1406-1410). For example, electrically conductive features of the device layer 1404 (e.g., the gate 1422 and the S/D contacts 1424) may be electrically coupled with the interconnect structures 1428 of the interconnect layers 1406-1410. The one or more interconnect layers 1406-1410 may form a metallization stack 1419 of the IC device 1400. In some embodiments, one or more transistors 120, in accordance with any of the embodiments disclosed herein, may be disposed in one or more of the interconnect layers 1406-1410, in accordance with any of the techniques disclosed herein. No such transistors 120 are depicted in FIG. 13 for ease of illustration, but any number and arrangement of transistors 120 may be included in any one or more of the layers in a metallization stack 1419. A transistors 120 included in the metallization stack 1419 may be referred to as a "back-end" device. In some embodiments, the IC device 1400 may not include any back-end transistors 120; in some embodiments, the IC device 1400 may include both front- and back-end transistors 120. One or more transistors 120 in the metallization stack 1619 may be coupled to any suitable ones of the devices in the device layer 1404, and/or to one or more of the conductive contacts 1436 (discussed below).

The interconnect structures 1428 may be arranged within the interconnect layers 1406-1410 to route electrical signals according to a wide variety of designs (in particular, the arrangement is not limited to the particular configuration of interconnect structures 1428 depicted in FIG. 13). Although a particular number of interconnect layers 1406-1410 is depicted in FIG. 13, embodiments of the present disclosure include IC devices having more or fewer interconnect layers than depicted.

In some embodiments, the interconnect structures 1428 may include trench structures 1428*a* (sometimes referred to as "lines") and/or via structures 1428*b* (sometimes referred to as "holes") filled with an electrically conductive material such as a metal. The trench structures 1428*a* may be arranged to route electrical signals in a direction of a plane that is substantially parallel with a surface of the substrate 1402 upon which the device layer 1404 is formed. For example, the trench structures 1428*a* may route electrical signals in a direction in and out of the page from the perspective of FIG. 13. The via structures 1428*b* may be arranged to route electrical signals in a direction of a plane that is substantially perpendicular to the surface of the substrate 1402 upon which the device layer 1404 is formed. In some embodiments, the via structures 1428*b* may electrically couple trench structures 1428*a* of different interconnect layers 1406-1410 together.

The interconnect layers 1406-1410 may include a dielectric material 1426 disposed between the interconnect structures 1428, as shown in FIG. 13. In some embodiments, the dielectric material 1426 disposed between the interconnect structures 1428 in different ones of the interconnect layers 1406-1410 may have different compositions; in other embodiments, the composition of the dielectric material 1426 between different interconnect layers 1406-1410 may be the same.

A first interconnect layer 1406 (referred to as Metal 1 or "M1") may be formed directly on the device layer 1404. In some embodiments, the first interconnect layer 1406 may include trench structures 1428*a* and/or via structures 1428*b*, as shown. The trench structures 1428*a* of the first interconnect layer 1406 may be coupled with contacts (e.g., the S/D contacts 1424) of the device layer 1404.

A second interconnect layer 1408 (referred to as Metal 2 or "M2") may be formed directly on the first interconnect layer 1406. In some embodiments, the second interconnect layer 1408 may include via structures 1428*b* to couple the trench structures 1428*a* of the second interconnect layer 1408 with the trench structures 1428*a* of the first interconnect layer 1406. Although the trench structures 1428*a* and the via structures 1428*b* are structurally delineated with a line within each interconnect layer (e.g., within the second interconnect layer 1408) for the sake of clarity, the trench structures 1428*a* and the via structures 1428*b* may be structurally and/or materially contiguous (e.g., simultaneously filled during a dual-damascene process) in some embodiments.

A third interconnect layer 1410 (referred to as Metal 3 or "M3") (and additional interconnect layers, as desired) may be formed in succession on the second interconnect layer 1408 according to similar techniques and configurations described in connection with the second interconnect layer 1408 or the first interconnect layer 1406.

The IC device 1400 may include a solder resist material 1434 (e.g., polyimide or similar material) and one or more conductive contacts 1436 formed on the interconnect layers 1406-1410. The conductive contacts 1436 may be electrically coupled with the interconnect structures 1428 and configured to route the electrical signals of the transistor(s) 1440 to other external devices. For example, solder bonds may be formed on the one or more conductive contacts 1436 to mechanically and/or electrically couple a chip including the IC device 1400 with another component (e.g., a circuit board). The IC device 1400 may have other alternative configurations to route the electrical signals from the interconnect layers 1406-1410 than depicted in other embodiments. For example, the bond pads illustrated as the conductive contacts 1436 may be replaced by or may further include other analogous features (e.g., posts) that route the electrical signals to external components.

Figure 14:
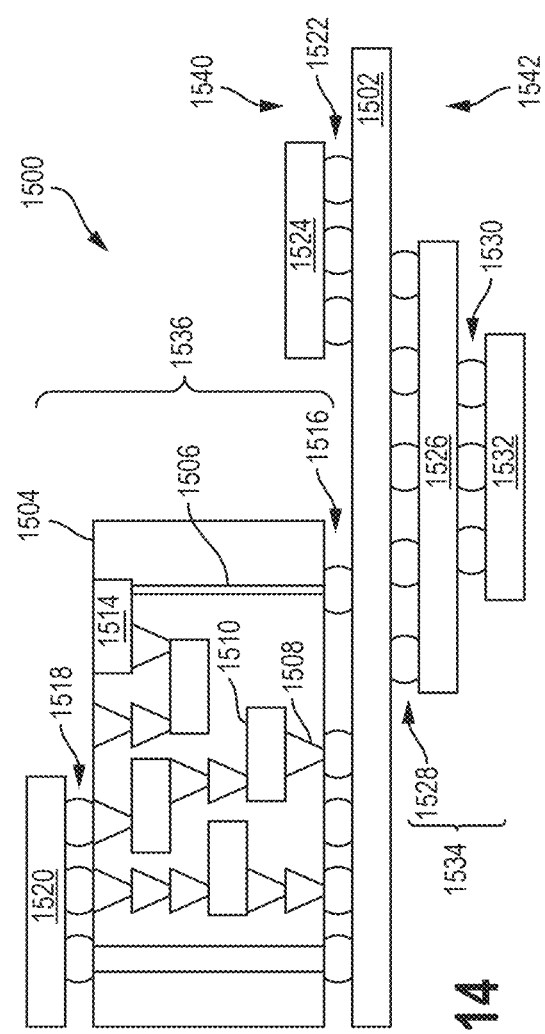
FIG. 14 is a cross-sectional side view of an IC device assembly that may include one or more gate stacks, in accordance with any of the embodiments disclosed herein.

FIG. 14 is a cross-sectional side view of an IC device assembly 1500 that may include components having one or more gate stacks in accordance with any of the embodiments disclosed herein. The IC device assembly 1500 includes a number of components disposed on a circuit board 1502 (which may be, e.g., a motherboard). The IC device assembly 1500 includes components disposed on a first face 1540 of the circuit board 1502 and an opposing second face 1542 of the circuit board 1502; generally, components may be disposed on one or both faces 1540 and 1542. In particular, any suitable ones of the components of the IC device assembly 1500 may include any of the gate stacks 100 disclosed herein (e.g., in any of the transistors 120 disclosed herein).

In some embodiments, the circuit board 1502 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1502. In other embodiments, the circuit board 1502 may be a non-PCB substrate.

The IC device assembly 1500 illustrated in FIG. 14 includes a package-on-interposer structure 1536 coupled to the first face 1540 of the circuit board 1502 by coupling components 1516. The coupling components 1516 may electrically and mechanically couple the package-on-interposer structure 1536 to the circuit board 1502, and may include solder balls (as shown in FIG. 14), male and female portions of a socket, an adhesive, an underfill material, and/or any other suitable electrical and/or mechanical coupling structure.

The package-on-interposer structure 1536 may include an IC package 1520 coupled to an interposer 1504 by coupling components 1518. The coupling components 1518 may take any suitable form for the application, such as the forms discussed above with reference to the coupling components 1516. Although a single IC package 1520 is shown in FIG. 14, multiple IC packages may be coupled to the interposer 1504; indeed, additional interposers may be coupled to the interposer 1504. The interposer 1504 may provide an intervening substrate used to bridge the circuit board 1502 and the IC package 1520. The IC package 1520 may be or include, for example, a die (the die 1302 of FIG. 12B), an IC device (e.g., the IC device 1400 of FIG. 13), or any other suitable component. Generally, the interposer 1504 may spread a connection to a wider pitch or reroute a connection to a different connection. For example, the interposer 1504 may couple the IC package 1520 (e.g., a die) to a ball grid array (BGA) of the coupling components 1516 for coupling to the circuit board 1502. In the embodiment illustrated in FIG. 14, the IC package 1520 and the circuit board 1502 are attached to opposing sides of the interposer 1504; in other embodiments, the IC package 1520 and the circuit board 1502 may be attached to a same side of the interposer 1504. In some embodiments, three or more components may be interconnected by way of the interposer 1504.

The interposer 1504 may be formed of an epoxy resin, a fiberglass-reinforced epoxy resin, a ceramic material, or a polymer material such as polyimide. In some implementations, the interposer 1504 may be formed of alternate rigid or flexible materials that may include the same materials described above for use in a semiconductor substrate, such as silicon, germanium, and other group III-V and group IV materials. The interposer 1504 may include metal interconnects 1508 and vias 1510, including but not limited to through-silicon vias (TSVs) 1506. The interposer 1504 may further include embedded devices 1514, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on the interposer 1504. The package-on-interposer structure 1536 may take the form of any of the package-on-interposer structures known in the art.

The IC device assembly 1500 may include an IC package 1524 coupled to the first face 1540 of the circuit board 1502 by coupling components 1522. The coupling components 1522 may take the form of any of the embodiments discussed above with reference to the coupling components 1516, and the IC package 1524 may take the form of any of the embodiments discussed above with reference to the IC package 1520.

The IC device assembly 1500 illustrated in FIG. 14 includes a package-on-package structure 1534 coupled to the second face 1542 of the circuit board 1502 by coupling components 1528. The package-on-package structure 1534 may include an IC package 1526 and an IC package 1532 coupled together by coupling components 1530 such that the IC package 1526 is disposed between the circuit board 1502 and the IC package 1532. The coupling components 1528 and 1530 may take the form of any of the embodiments of the coupling components 1516 discussed above, and the IC packages 1526 and 1532 may take the form of any of the embodiments of the IC package 1520 discussed above. The package-on-package structure 1534 may be configured in accordance with any of the package-on-package structures known in the art.

Figure 15:
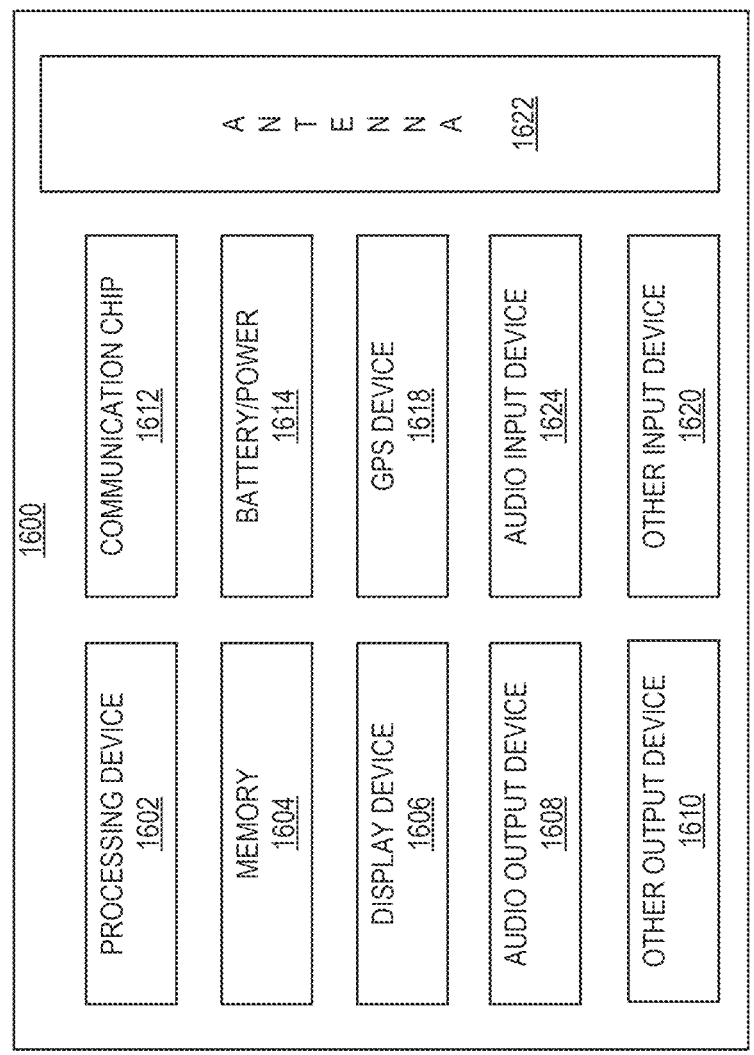
FIG. 15 is a block diagram of an example computing device that may include one or more gate stacks, in accordance with any of the embodiments disclosed herein.

FIG. 15 is a block diagram of an example computing device 1600 that may include one or more components including one or more gate stacks in accordance with any of the embodiments disclosed herein. For example, any suitable ones of the components of the computing device 1600 may include a die (e.g., the die 1302 (FIG. 12B)) having one or more transistors 120 including one or more gate stacks 100. Any one or more of the components of the computing device 1600 may include, or be included in, an IC device 1400 (FIG. 13). Any one or more of the components of the computing device 1600 may include, or be included in, an IC device assembly 1500 (FIG. 14).

A number of components are illustrated in FIG. 15 as included in the computing device 1600, but any one or more of these components may be omitted or duplicated, as suitable for the application. In some embodiments, some or all of the components included in the computing device 1600 may be attached to one or more motherboards. In some embodiments, some or all of these components are fabricated onto a single system-on-a-chip (SoC) die.

Additionally, in various embodiments, the computing device 1600 may not include one or more of the components illustrated in FIG. 15, but the computing device 1600 may include interface circuitry for coupling to the one or more components. For example, the computing device 1600 may not include a display device 1606, but may include display device interface circuitry (e.g., a connector and driver circuitry) to which a display device 1606 may be coupled. In another set of examples, the computing device 1600 may not include an audio input device 1624 or an audio output device 1608, but may include audio input or output device interface circuitry (e.g., connectors and supporting circuitry) to which an audio input device 1624 or audio output device 1608 may be coupled.

The computing device 1600 may include a processing device 1602 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1602 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 1600 may include a memory 1604, which may itself include one or more memory devices such as volatile memory (e.g., DRAM), nonvolatile memory (e.g., read-only memory (ROM), flash memory, solid state memory, and/or a hard drive. In some embodiments, the memory 1604 may include memory that shares a die with the processing device 1602. This memory may be used as cache memory and may include eDRAM or spin transfer torque magnetic random access memory (STT-MRAM). The memory 1604 may include the transistors 120 as 1T memory cells, for example.

In some embodiments, the computing device 1600 may include a communication chip 1612 (e.g., one or more communication chips). For example, the communication chip 1612 may be configured for managing wireless communications for the transfer of data to and from the computing device 1600. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1612 may implement any of a number of wireless standards or protocols, including but not limited to Institute for Electrical and Electronic Engineers (IEEE) standards including Wi-Fi (IEEE 1402.11 family), IEEE 1402.16 standards (e.g., IEEE 1402.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 1402.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 1402.16 standards. The communication chip 1612 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1612 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1612 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1612 may operate in accordance with other wireless protocols in other embodiments. The computing device 1600 may include an antenna 1622 to facilitate wireless communications and/or to receive other wireless communications (such as AM or FM radio transmissions).

In some embodiments, the communication chip 1612 may manage wired communications, such as electrical, optical, or any other suitable communication protocols (e.g., the Ethernet). As noted above, the communication chip 1612 may include multiple communication chips. For instance, a first communication chip 1612 may be dedicated to shorter-range wireless communications such as Wi-Fi or Bluetooth, and a second communication chip 1612 may be dedicated to longer-range wireless communications such as global positioning system (GPS), EDGE, GPRS, CDMA, WiMAX, LTE, EV-DO, or others. In some embodiments, a first communication chip 1612 may be dedicated to wireless communications, and a second communication chip 1612 may be dedicated to wired communications.

The computing device 1600 may include battery/power circuitry 1614. The battery/power circuitry 1614 may include one or more energy storage devices (e.g., batteries or capacitors) and/or circuitry for coupling components of the computing device 1600 to an energy source separate from the computing device 1600 (e.g., AC line power).

The computing device 1600 may include a display device 1606 (or corresponding interface circuitry, as discussed above). The display device 1606 may include any visual indicators, such as a heads-up display, a computer monitor, a projector, a touchscreen display, a liquid crystal display (LCD), a light-emitting diode display, or a flat panel display, for example.

The computing device 1600 may include an audio output device 1608 (or corresponding interface circuitry, as discussed above). The audio output device 1608 may include any device that generates an audible indicator, such as speakers, headsets, or earbuds, for example.

The computing device 1600 may include an audio input device 1624 (or corresponding interface circuitry, as discussed above). The audio input device 1624 may include any device that generates a signal representative of a sound, such as microphones, microphone arrays, or digital instruments (e.g., instruments having a musical instrument digital interface (MIDI) output).

The computing device 1600 may include a GPS device 1618 (or corresponding interface circuitry, as discussed above). The GPS device 1618 may be in communication with a satellite-based system and may receive a location of the computing device 1600, as known in the art.

The computing device 1600 may include an other output device 1610 (or corresponding interface circuitry, as discussed above). Examples of the other output device 1610 may include an audio codec, a video codec, a printer, a wired or wireless transmitter for providing information to other devices, or an additional storage device.

The computing device 1600 may include an other input device 1620 (or corresponding interface circuitry, as discussed above). Examples of the other input device 1620 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1600 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1600 may be any other electronic device that processes data.

The following paragraphs provide various examples of the embodiments disclosed herein.

Example 1 is an integrated circuit (IC) structure, including: a substrate; one or more interconnect layers; and a transistor, including: a channel material, and a gate stack including a gate electrode material, and a ferroelectric material between the gate electrode material and the channel material; wherein the one or more interconnect layers are between the transistor and the substrate.

Example 2 includes the subject matter of Example 1, and further specifies that the ferroelectric material includes hafnium zirconium oxide, hafnium silicon oxide, hafnium aluminum oxide, hafnium yttrium oxide, hafnium lanthanum oxide, hafnium nickel oxide, or hafnium cobalt oxide.

Example 3 includes the subject matter of any of Examples 1-2, and further specifies that the ferroelectric material includes hafnium.

Example 4 includes the subject matter of Example 3, and further specifies that the ferroelectric material further includes oxygen.

Example 5 includes the subject matter of any of Examples 3-4, and further specifies that the ferroelectric material further includes nitrogen.

Example 6 includes the subject matter of any of Examples 3-5, and further specifies that the ferroelectric material further includes zirconium, silicon, aluminum, yttrium, lanthanum, nickel, or cobalt.

Example 7 includes the subject matter of any of Examples 1-6, and further specifies that the ferroelectric material includes zirconium.

Example 8 includes the subject matter of Example 7, and further specifies that the ferroelectric material includes oxygen.

Example 9 includes the subject matter of any of Examples 1-8, and further specifies that the ferroelectric material includes zirconium oxide.

Example 10 includes the subject matter of any of Examples 1-9, and further specifies that the ferroelectric material includes lead, zirconium, titanium, and oxygen.

Example 11 includes the subject matter of any of Examples 1-10, and further specifies that the ferroelectric material includes lead zirconate titanate.

Example 12 includes the subject matter of any of Examples 1-11, and further specifies that the ferroelectric material includes bismuth, iron, and oxygen.

Example 13 includes the subject matter of any of Examples 1-12, and further specifies that the ferroelectric material includes bismuth ferrite.

Example 14 includes the subject matter of any of Examples 1-13, and further specifies that the ferroelectric material includes lanthanum, strontium, manganese, and oxygen.

Example 15 includes the subject matter of any of Examples 1-14, and further specifies that the ferroelectric material includes lanthanum strontium manganate.

Example 16 includes the subject matter of any of Examples 1-15, and further specifies that the ferroelectric material includes a perovskite material.

Example 17 includes the subject matter of any of Examples 1-16, and further specifies that the ferroelectric material has a thickness between 2 nanometers and 20 nanometers.

Example 18 includes the subject matter of any of Examples 1-17, and further specifies that the ferroelectric material includes an orthorhombic crystal lattice.

Example 19 includes the subject matter of Example 18, and further specifies that at least 20% of crystals of the ferroelectric material are arranged in an orthorhombic crystal lattice.

Example 20 includes the subject matter of any of Examples 1-19, and further specifies that at least 5% of crystals of the ferroelectric material have a grain orientation that is aligned with a grain orientation of the gate electrode material.

Example 21 includes the subject matter of any of Examples 1-20, and further specifies that at least 5% of crystals of the ferroelectric material have a grain orientation that is aligned with a grain orientation of the channel material.

Example 22 includes the subject matter of any of Examples 1-21, and further specifies that the channel material includes indium gallium zinc oxide or a single-crystal semiconductor material.

Example 23 includes the subject matter of any of Examples 1-21, and further specifies that the channel material includes tin oxide, antimony oxide, indium oxide, indium tin oxide, titanium oxide, zinc oxide, indium zinc oxide, gallium oxide, titanium oxynitride, ruthenium oxide, strontium oxide, or tungsten oxide.

Example 24 includes the subject matter of any of Examples 1-21, and further specifies that the channel material has a bandgap greater than Example 1.3 electron-volts.

Example 25 includes the subject matter of any of Examples 1-21, and further specifies that the channel material includes a semiconductor material.

Example 26 includes the subject matter of any of Examples 1-21, and further specifies that the channel material includes a metal.

Example 27 includes the subject matter of any of Examples 1-26, and further specifies that the ferroelectric material is in contact with the channel material.

Example 28 includes the subject matter of any of Examples 1-27, and further specifies that the gate stack further includes: an intermediate material between the ferroelectric material and the channel material.

Example 29 includes the subject matter of Example 28, and further specifies that the intermediate material includes a high-k dielectric material.

Example 30 includes the subject matter of any of Examples 28-29, and further specifies that the intermediate material includes hafnium oxide, zirconium oxide, aluminum oxide, tantalum oxide, tantalum silicon oxide, hafnium silicon oxide, or lanthanum oxide.

Example 31 includes the subject matter of any of Examples 28-30, and further specifies that the intermediate material is a depolarization layer.

Example 32 includes the subject matter of any of Examples 28-31, and further specifies that the intermediate material is a first intermediate material, and the gate stack further includes: a second intermediate material between the ferroelectric material and the gate electrode material.

Example 33 includes the subject matter of any of Examples 32, and further specifies that the second intermediate material is an adhesion layer.

Example 34 includes the subject matter of any of Examples 32-33, and further specifies that the second intermediate material includes aluminum oxide.

Example 35 includes the subject matter of any of Examples 32-34, and further specifies that the second intermediate material has a thickness that is less than 5 nanometers.

Example 36 includes the subject matter of any of Examples 1-27, and further specifies that the gate stack further includes: an intermediate material between the ferroelectric material and the gate electrode material.

Example 37 includes the subject matter of Example 36, and further specifies that the intermediate material is an adhesion layer.

Example 38 includes the subject matter of any of Examples 36-37, and further specifies that the intermediate material includes aluminum oxide.

Example 39 includes the subject matter of any of Examples 36-38, and further specifies that the intermediate material has a thickness that is less than 5 nanometers.

Example 40 includes the subject matter of any of Examples 1-39, and further specifies that the transistor is part of a memory cell.

Example 41 includes the subject matter of any of Examples 40, and further specifies that the memory cell does not include a capacitor.

Example 42 includes the subject matter of any of Examples 40-41, and further specifies that the memory cell is a 1-transistor (1T) memory cell.

Example 43 includes the subject matter of any of Examples 1-42, and further specifies that the transistor is a thin film transistor.

Example 44 includes the subject matter of any of Examples 1-42, and further specifies that the gate electrode material is between the substrate and the ferroelectric material.

Example 45 includes the subject matter of any of Examples 1-42, and further specifies that the ferroelectric material is between the substrate and the gate electrode material.

Example 46 includes the subject matter of any of Examples 1-45, and further specifies that the gate electrode material wraps at least partially around the channel material.

Example 47 includes the subject matter of any of Examples 1-45, and further specifies that the gate electrode material wraps entirely around the channel material.

Example 48 includes the subject matter of any of Examples 1-47, and further specifies that the gate electrode material includes titanium, copper, tantalum, nickel, or cobalt.

Example 49 is an integrated circuit (IC) structure, including a transistor, including: a channel material, and a gate stack including a gate electrode material, and a material between the gate electrode material and the channel material, wherein at least 20% of crystals of the material are arranged in an orthorhombic crystal lattice.

Example 50 includes the subject matter of Example 49, and further specifies that at least 5% of crystals of the material have a grain orientation that is aligned with a grain orientation of the gate electrode material, or at least 5% of crystals of the material have a grain orientation that is aligned with a grain orientation of the channel material.

Example 51 includes the subject matter of any of Examples 49-50, and further specifies that the material is a ferroelectric material.

Example 52 includes the subject matter of any of Examples 49-51, and further specifies that the material includes hafnium zirconium oxide, hafnium silicon oxide, hafnium aluminum oxide, hafnium yttrium oxide, hafnium lanthanum oxide, hafnium nickel oxide, or hafnium cobalt oxide.

Example 53 includes the subject matter of any of Examples 49-52, and further specifies that the material includes hafnium.

Example 54 includes the subject matter of any of Examples 53, and further specifies that the material further includes oxygen.

Example 55 includes the subject matter of any of Examples 53-54, and further specifies that the material further includes nitrogen.

Example 56 includes the subject matter of any of Examples 53-55, and further specifies that the material further includes zirconium, silicon, aluminum, yttrium, lanthanum, nickel, or cobalt.

Example 57 includes the subject matter of any of Examples 49-56, and further specifies that the material includes zirconium.

Example 58 includes the subject matter of Example 57, and further specifies that the material includes oxygen.

Example 59 includes the subject matter of any of Examples 49-58, and further specifies that the material includes zirconium oxide.

Example 60 includes the subject matter of any of Examples 49-59, and further specifies that the material includes lead, zirconium, titanium, and oxygen.

Example 61 includes the subject matter of any of Examples 49-60, and further specifies that the material includes lead zirconate titanate.

Example 62 includes the subject matter of any of Examples 49-61, and further specifies that the material includes bismuth, iron, and oxygen.

Example 63 includes the subject matter of any of Examples 49-62, and further specifies that the material includes bismuth ferrite.

Example 64 includes the subject matter of any of Examples 49-63, and further specifies that the material includes lanthanum, strontium, manganese, and oxygen.

Example 65 includes the subject matter of any of Examples 49-64, and further specifies that the material includes lanthanum strontium manganate.

Example 66 includes the subject matter of any of Examples 49-65, and further specifies that the material includes a perovskite material.

Example 67 includes the subject matter of any of Examples 49-66, and further specifies that the material has a thickness between 2 nanometers and 20 nanometers.

Example 68 includes the subject matter of any of Examples 49-67, and further specifies that the channel material includes indium gallium zinc oxide or a single-crystal semiconductor material.

Example 69 includes the subject matter of any of Examples 49-67, and further specifies that the channel material includes tin oxide, antimony oxide, indium oxide, indium tin oxide, titanium oxide, zinc oxide, indium zinc oxide, gallium oxide, titanium oxynitride, ruthenium oxide, strontium oxide, or tungsten oxide.

Example 70 includes the subject matter of any of Examples 49-67, and further specifies that the channel material has a bandgap greater than Example 1.3 electron-volts.

Example 71 includes the subject matter of any of Examples 49-67, and further specifies that the channel material includes a semiconductor material.

Example 72 includes the subject matter of any of Examples 49-67, and further specifies that the channel material includes a metal.

Example 73 includes the subject matter of any of Examples 49-72, and further specifies that the material is in contact with the channel material.

Example 74 includes the subject matter of any of Examples 49-73, and further specifies that the gate stack further includes: an intermediate material between the material and the channel material.

Example 75 includes the subject matter of Example 74, and further specifies that the intermediate material includes a high-k dielectric material.

Example 76 includes the subject matter of any of Examples 74-75, and further specifies that the intermediate material includes hafnium oxide, zirconium oxide, aluminum oxide, tantalum oxide, tantalum silicon oxide, hafnium silicon oxide, or lanthanum oxide.

Example 77 includes the subject matter of any of Examples 74-76, and further specifies that the intermediate material is a depolarization layer.

Example 78 includes the subject matter of any of Examples 74-77, and further specifies that the intermediate material is a first intermediate material, and the gate stack further includes: a second intermediate material between the material and the gate electrode material.

Example 79 includes the subject matter of Example 78, and further specifies that the second intermediate material is an adhesion layer.

Example 80 includes the subject matter of any of Examples 78-79, and further specifies that the second intermediate material includes aluminum oxide.

Example 81 includes the subject matter of any of Examples 78-80, and further specifies that the second intermediate material has a thickness that is less than 5 nanometers.

Example 82 includes the subject matter of any of Examples 49-73, and further specifies that the gate stack further includes: an intermediate material between the material and the gate electrode material.

Example 83 includes the subject matter of Example 82, and further specifies that the intermediate material is an adhesion layer.

Example 84 includes the subject matter of any of Examples 82-83, and further specifies that the intermediate material includes aluminum oxide.

Example 85 includes the subject matter of any of Examples 82-84, and further specifies that the intermediate material has a thickness that is less than 5 nanometers.

Example 86 includes the subject matter of any of Examples 49-85, and further specifies that the transistor is part of a memory cell.

Example 87 includes the subject matter of Example 86, and further specifies that the memory cell does not include a capacitor.

Example 88 includes the subject matter of any of Examples 86-87, and further specifies that the memory cell is a 1-transistor (1T) memory cell.

Example 89 includes the subject matter of any of Examples 49-88, and further specifies that the IC structure further includes: a substrate.

Example 90 includes the subject matter of Example 89, and further specifies that the gate electrode material is between the substrate and the material.

Example 91 includes the subject matter of Example 89, and further specifies that the material is between the substrate and the gate electrode material.

Example 92 includes the subject matter of any of Examples 49-91, and further specifies that the gate electrode material wraps at least partially around the channel material.

Example 93 includes the subject matter of any of Examples 49-91, and further specifies that the gate electrode material wraps entirely around the channel material.

Example 94 includes the subject matter of any of Examples 49-93, and further specifies that the gate electrode material includes titanium, copper, tantalum, nickel, or cobalt.

Example 95 is a computing device, including: an integrated circuit (IC) package, including: a package substrate; and an integrated circuit (IC) die coupled to the package substrate, wherein the IC die includes a 1-transistor (1T) memory cell, and the 1T memory cell includes: a channel material, a gate electrode material, and a ferroelectric material between the channel material and the gate electrode material.

Example 96 includes the subject matter of Example 95, and further specifies that the computing device is a wearable or handheld computing device.

Example 97 includes the subject matter of any of Examples 95-96, and further includes: a circuit board coupled to the IC package.

Example 98 includes the subject matter of Example 97, and further specifies that the circuit board is a motherboard.

Example 99 includes the subject matter of any of Examples 97-98, and further includes: one or more communication chips coupled to the circuit board.

Example 100 includes the subject matter of any of Examples 95-99, and further specifies that the IC package is a memory package.

Example 101 includes the subject matter of any of Examples 95-100, and further specifies that the 1T memory cell is one of an array of multiple 1T memory cells included in the IC die.

Example 102 includes the subject matter of any of Examples 95-101, and further specifies that the 1T memory cell is in a front-end of the IC die.

Example 103 includes the subject matter of any of Examples 95-101, and further specifies that the 1T memory cell is in a back-end of the IC die.

Example 104 includes the subject matter of any of Examples 95-103, and further includes: a display device.

Example 105 is a method of manufacturing a 1-transistor (1T) memory cell, including: providing a gate electrode material; providing a ferroelectric material; and providing a channel material such that the ferroelectric material is between the channel material and the gate electrode material.

Example 106 includes the subject matter of Example 105, and further specifies that providing the ferroelectric material comprises performing atomic layer deposition, physical vapor deposition, or chemical vapor deposition of the ferroelectric material.

Example 107 includes the subject matter of any of Examples 105-106, and further includes: annealing the channel material, ferroelectric material, and gate electrode material.

Example 108 includes the subject matter of any of Examples 105-107, and further includes: providing an intermediate material, different from the channel material and the ferroelectric material, such that the intermediate material is between the channel material and the ferroelectric material.

Example 109 includes the subject matter of Example 108, and further specifies that the intermediate material is a first intermediate material, and the method further includes: providing a second intermediate material, different from the gate electrode material and the ferroelectric material, such that the second intermediate material is between the gate electrode material and the ferroelectric material.

Example 110 includes the subject matter of any of Examples 105-107, and further includes: providing an intermediate material, different from the gate electrode material and the ferroelectric material, such that the intermediate material is between the gate electrode material and the ferroelectric material.

Example 111 is an integrated circuit (IC) die, including any of the IC structures of any of Examples 1-94.

Example 112 is an integrated circuit (IC) package, including a package substrate and an IC die coupled to the package substrate, wherein the IC die includes any of the IC structures of any of Examples 1-94.

Example 113 is a computing device, including a circuit board and an integrated circuit (IC) die communicatively coupled to the circuit board, wherein the IC die includes any of the IC structures of any of Examples 1-94.

The invention claimed is:
1. An integrated circuit (IC) structure, comprising:
   a substrate;
   one or more interconnect layers; and
   a transistor, including:
      a channel material, and
      a gate stack, including:
         a gate electrode material, and
         a ferroelectric material between the gate electrode material and the channel material, wherein at least 5% of crystals of the ferroelectric material have a grain orientation that is aligned with a grain orientation of the channel material;

wherein the one or more interconnect layers are between the transistor and the substrate.

2. The IC structure of claim 1, wherein the ferroelectric material has a thickness between 2 nanometers and 20 nanometers.

3. The IC structure of claim 1, wherein the ferroelectric material includes an orthorhombic crystal lattice.

4. The IC structure of claim 3, wherein at least 20% of crystals of the ferroelectric material are arranged in an orthorhombic crystal lattice.

5. The IC structure of claim 1, wherein at least 5% of crystals of the ferroelectric material have a grain orientation that is aligned with a grain orientation of the gate electrode material.

6. The IC structure of claim 1, wherein the ferroelectric material is in contact with the channel material.

7. The IC structure of claim 1, wherein the gate stack further includes:
an intermediate material between the ferroelectric material and the channel material.

8. The IC structure of claim 7, wherein the intermediate material includes a high-k dielectric material.

9. The IC structure of claim 1, wherein the gate stack further includes:
an intermediate material between the ferroelectric material and the gate electrode material.

10. The IC structure of claim 9, wherein the intermediate material is an adhesion layer.

11. The IC structure of claim 1, wherein the transistor is a tri-gate transistor.

12. The IC structure of claim 1, wherein the transistor is a gate-all-around transistor.

13. A computing device, comprising:
an integrated circuit (IC) package, including:
a package substrate, and
an integrated circuit (IC) structure coupled to the package substrate, the IC structure comprising:
a substrate,
one or more interconnect layers, and
a transistor, the transistor including a channel material and a gate stack, wherein the gate stack includes a gate electrode material, and a ferroelectric material between the gate electrode material and the channel material, and wherein at least 5% of crystals of the ferroelectric material have a grain orientation that is aligned with a grain orientation of the channel material,
wherein the one or more interconnect layers are between the transistor and the substrate.

14. The computing device of claim 13, further comprising:
a circuit board coupled to the IC package.

15. The computing device of claim 13, wherein the transistor is in a front-end of the IC structure.

16. The computing device of claim 13, wherein the transistor is in a back-end of the IC structure.

17. A process of making an integrated circuit (IC) structure, the process comprising:
providing one or more interconnect layers over a substrate; and
providing a transistor, the transistor including:
a channel material, and
a gate stack, including:
a gate electrode material, and
a ferroelectric material between the gate electrode material and the channel material,
wherein at least 5% of crystals of the ferroelectric material have a grain orientation that is aligned with a grain orientation of the gate electrode material;
wherein the one or more interconnect layers are between the transistor and the substrate.

18. The process of claim 17, further comprising:
annealing the channel material, the ferroelectric material, and the gate electrode material.

19. The process of claim 17, wherein at least 20% of crystals of the ferroelectric material are arranged in an orthorhombic crystal lattice.

20. The process of claim 17, wherein at least 5% of crystals of the ferroelectric material have a grain orientation that is aligned with a grain orientation of the channel material.

* * * * *